United States Patent
Rajagopal et al.

(10) Patent No.: US 12,074,607 B2
(45) Date of Patent: Aug. 27, 2024

(54) ANALOG-TO-DIGITAL CONVERTER (ADC) HAVING LINEARIZATION CIRCUIT WITH RECONFIGURABLE LOOKUP TABLE (LUT) MEMORY AND CALIBRATION OPTIONS

(71) Applicant: TEXAS INSTRUMENTS INCORPORATED, Dallas, TX (US)

(72) Inventors: Narasimhan Rajagopal, Chennai (IN); Nithin Gopinath, Bengaluru (IN); Viswanathan Nagarajan, Bengaluru (IN); Neeraj Shrivastava, Bengaluru (IN); Visvesvaraya A. Pentakota, Bengaluru (IN); Harshit Moondra, Mumbai (IN); Abhinav Chandra, Bengaluru (IN)

(73) Assignee: Texas Instruments Incorporated, Dallas, TX (US)

(*) Notice: Subject to any disclaimer, the term of this patent is extended or adjusted under 35 U.S.C. 154(b) by 107 days.

(21) Appl. No.: 17/825,864

(22) Filed: May 26, 2022

(65) Prior Publication Data
US 2023/0387932 A1    Nov. 30, 2023

(51) Int. Cl.
*H03M 1/10*    (2006.01)

(52) U.S. Cl.
CPC ................................ *H03M 1/1014* (2013.01)

(58) Field of Classification Search
CPC .... H03M 1/12; H03M 1/1042; H03M 1/1038; H03M 1/468; H03M 1/0626; H03M 1/1019; H03M 1/1245; H03M 1/60; H03M 1/00; H03M 1/002; H03M 1/0617; H03M 1/0678; H03M 1/0695; H03M 1/1004; H03M 1/1009; H03M 1/1071; H03M 1/109; H03M 1/121; H03M 1/123; H03M 1/124; H03M 1/125; H03M 1/14; H03M 1/38; H03M 1/462; H03M 1/466; H03M 1/502; H03M 1/66; H03M 1/662; H03M 1/68; H03M 3/30; H03M 3/38; H03M 3/386; H03M 3/388; H03M 3/412
USPC .................................. 341/118–121, 143, 155
See application file for complete search history.

(56) References Cited

U.S. PATENT DOCUMENTS

| | | | | |
|---|---|---|---|---|
| 5,361,067 A * | 11/1994 | Pinckley | ............. | H03M 1/1052 341/120 |
| 5,949,918 A * | 9/1999 | McCaffrey | ........... | H04N 1/4072 348/E5.073 |
| 6,661,365 B1 * | 12/2003 | Bugeja | ................ | H03M 1/1038 341/157 |
| 6,690,311 B2 * | 2/2004 | Lundin | ............... | H03M 1/1038 341/120 |
| 9,407,276 B1 * | 8/2016 | Coban | ................. | H03M 1/1009 |

(Continued)

*Primary Examiner* — Linh V Nguyen
(74) *Attorney, Agent, or Firm* — Valerie M. Davis; Frank D. Cimino

(57) ABSTRACT

A circuit includes a nonlinear analog-to-digital converter (ADC) configured to provide a first digital output based on an analog input signal. The circuit also includes a linearization circuit having a lookup table (LUT) memory configured to store initial calibration data. The linearization circuit is coupled to the nonlinear ADC and is configured to: determine updated calibration data based on the initial calibration data; replace the initial calibration data in the LUT memory with the updated calibration data; and provide a second digital output at a linearization circuit output of the linearization circuit based on the first digital output and the updated calibration data.

21 Claims, 11 Drawing Sheets

(56) References Cited

U.S. PATENT DOCUMENTS

| | | |
|---|---|---|
| 9,634,681 B1 * | 4/2017 | Kunnen ............... H03M 1/1042 |
| 10,284,188 B1 | 5/2019 | Soundararajan et al. |
| 10,673,452 B1 | 6/2020 | Soundararajan et al. |
| 10,673,453 B1 | 6/2020 | Pentakota et al. |
| 10,673,456 B1 | 6/2020 | Dusad et al. |
| 11,316,525 B1 | 4/2022 | Pentakota et al. |
| 11,316,526 B1 | 4/2022 | Rajagopal et al. |
| 2005/0253652 A1 * | 11/2005 | Song ..................... H03F 1/3247 |
| | | 330/149 |
| 2010/0033359 A1 * | 2/2010 | Madisetti ............ H03M 1/1038 |
| | | 341/155 |
| 2011/0199096 A1 * | 8/2011 | Kidambi ............. H03M 1/1042 |
| | | 324/615 |
| 2014/0368366 A1 * | 12/2014 | Galton .................. H03M 3/386 |
| | | 341/143 |
| 2017/0357219 A1 * | 12/2017 | Chiu ........................ H03M 1/38 |
| 2022/0416729 A1 * | 12/2022 | Azadet .................... H03F 3/195 |

\* cited by examiner

ANALOG-TO-DIGITAL CONVERTER (ADC) HAVING LINEARIZATION CIRCUIT WITH RECONFIGURABLE LOOKUP TABLE (LUT) MEMORY AND CALIBRATION OPTIONS

BACKGROUND

Many electronic systems include an analog-to-digital converter (ADC), which converts an analog input signal to a digital output signal. The performance (e.g., power consumption, speed, and accuracy) and area of different ADC topologies varies. One example ADC topology is a delay domain ADC topology, which enables high-speed operation with power and area advantages compared to other ADC topologies (e.g., pipeline or successive-approximation (SAR) topologies). Examples of such ADC topology are illustrated in U.S. Pat. Nos. 10,284,188, 10,673,456, 10,673,452, and 10,673,453, all of which are hereby incorporated by reference in their entirety. While the delay domain topology has lower power consumption and area relative to the pipelined topology, it suffers from nonlinearity. To compensate for such nonlinearity, a calibration using known inputs is used to determine an inverse mapping that will correct for nonlinear distortion. The known inputs are generated, for example, by a digital-to-analog converter (DAC). Examples of such calibration are illustrated in U.S. patent application Ser. No. 17/126,157 (filed on Dec. 18, 2020); Ser. No. 17/158,526 (filed on Jan. 26, 2021); Ser. No. 17/133,745 (filed on Dec. 24, 2020); Ser. No. 17/467,561 (filed on Sep. 7, 2021); Ser. No. 17/568,972 (filed on Jan. 5, 2022) and Ser. No. 17/588,493 (filed on Jan. 31, 2022), all of which are hereby incorporated by reference in their entirety. In one technique, calibration operations result in a lookup table (LUT) with LUT data that corrects for nonlinearity. Noise issues during the calibration process (e.g., flicker noise of the DAC) affect the accuracy of calibration.

SUMMARY

In one example embodiment, a circuit comprises a nonlinear analog-to-digital converter (ADC) having a nonlinear ADC input and a nonlinear ADC output. The nonlinear ADC is configured to: receive an analog input signal at the nonlinear ADC input; and provide a first digital output at the nonlinear ADC output based on the analog input signal. The circuit also comprises a linearization circuit having a linearization circuit input, a linearization circuit output and a lookup table (LUT) memory configured to store initial calibration data. The linearization circuit input is coupled to the nonlinear ADC output and is configured to: store updated calibration data based on the initial calibration data in the LUT memory; and provide a second digital output at the linearization circuit output based on the first digital output and the updated calibration data.

In another example embodiment, a linear ADC comprises: a nonlinear ADC configured to provide a first digital output based on an analog input signal; and a linearization circuit coupled to the nonlinear ADC and having a LUT memory configured to store initial calibration data. The linearization circuit is configured to: store updated calibration data based on the initial calibration data; replace the initial calibration data in the LUT memory with the updated calibration data; and provide a second digital output at the linearization circuit output based on the first digital output and the updated calibration data.

In yet another example embodiment, a method for calibrating a linearization circuit having a LUT memory and related to a nonlinear ADC is described. The method comprises: controlling, by a calibration control circuit, a DAC to apply a DAC ramp to the nonlinear ADC multiple times to obtain initial calibration data for the nonlinear ADC; and storing, by the linearization circuit, the initial calibration data in the LUT memory. The method also comprises: determining, by the calibration control circuit, updated calibration data based on the initial calibration data; and replacing, by the linearization circuit, the initial calibration data in the LUT memory with LUTs based on the updated calibration data.

BRIEF DESCRIPTION OF THE DRAWINGS

For a detailed description of various examples, reference will now be made to the accompanying drawings in which.

The same reference numbers or other reference designators are used in the drawings to designate the same or similar (either by function and/or structure) features.

DETAILED DESCRIPTION

Figure 1:
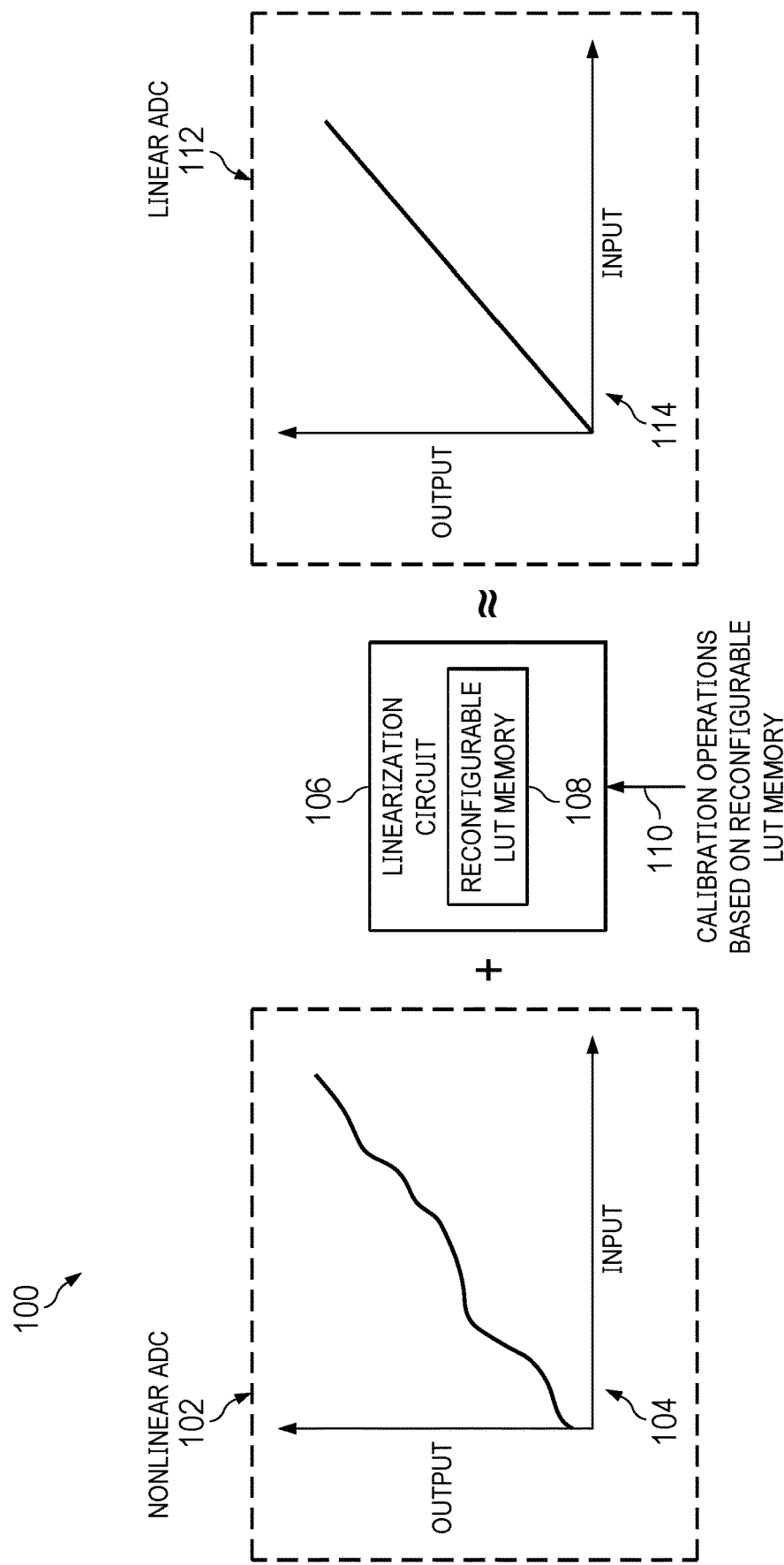
FIG. 1 is a diagram showing an analog-to-digital converter (ADC) technique in accordance with an example embodiment.

FIG. 1 is a diagram showing an analog-to-digital converter (ADC) technique 100 in accordance with an example embodiment. As shown, the ADC technique 100 combines a nonlinear ADC 102 with a linearization circuit 106 to approximate a linear ADC 112. In FIG. 1, the behavior of the nonlinear ADC 102 is represented by graph 104, which shows an ADC output value (e.g., a digital representation of an analog input signal) that is nonlinear as a function of ADC input value. To obtain a linear ADC output value (represented by graph 114 of the linear ADC 112) from the nonlinear ADC output value of the nonlinear ADC 102, the linearization circuit 106 is used.

In some example embodiments, the linearization circuit 106 operates in a calibration mode and an operational mode. In both modes, the reconfigurable LUT memory 108 (comprised, for example, of any type of volatile or non-volatile memory, such as one or more registers, dynamic random access memory, static random access memory, ferroelectric memory, flash memory and/or any combination thereof) is used to store information. However, initial calibration data stored in the reconfigurable LUT memory 108 during the calibration mode is eventually replaced with updated calibration data (or possibly intermediate calibration data during the update process), where the updated calibration data provides a calibration error correction that is not accounted for by the initial calibration data. In some example embodiments, the calibration operations include: obtaining and storing initial calibration data (related to the nonlinear ADC 102) in the reconfigurable LUT memory 108; determining updated calibration data based on the initial calibration data; and storing the updated calibration data in the reconfigurable LUT memory 108, where the updated calibration data replaces the initial calibration data in the reconfigurable LUT memory 108. In some example embodiments, the calibration operations may also include determining and storing intermediate calibration data in the reconfigurable LUT memory 108 as part of the process of determining the updated calibration data. Without limitation, the updated calibration data is based on averaging the initial calibration data. In this example, the intermediate calibration data may be partially averaged data. Additionally, or alternatively, the process of determining updated calibration data and/or intermediate calibration data based on the initial calibration data may involve exponential averaging, filtering, and/or interpolation.

In some example embodiments, the initial calibration data is based on a digital-to-analog converter (DAC) being controlled to iteratively apply DAC ramps to the nonlinear ADC 102. Without limitation, the initial calibration data may include compressed single DAC ramp fill data. For example, some of the LUTs of the reconfigurable LUT memory 108 may store a different iteration of single DAC ramp fill data, while another of the LUTs of the reconfigurable LUT memory 108 may store the updated calibration data. After the updated calibration data is determined based on the iterations of single ramp fill data, the updated calibration data may be stored in each of multiple LUTs of the reconfigurable LUT memory 108. Depending on the number of iterations of single DAC ramp fill data to be used, some of the LUTs of the reconfigurable LUT memory 108 may store compressed intermediate calibration data (e.g., partially averaged data based on a plurality of single DAC ramp fills). As an example, if 16 iterations of single DAC ramp fill data is used to determine the updated calibration data, the intermediate calibration data may correspond to partially averaged data (e.g., the average of 4 of 16 iterations of single DAC ramp fill data). The updated calibration data stored in the reconfigurable LUT memory 108 may include final calibration data for one round of calibration based on multiple DAC fill ramps (e.g., the updated calibration data may be the average of a plurality of single DAC ramp fills).

For embodiments that involve averaging the initial calibration data to determine the updated calibration data, the averaging options may vary. Example averaging options include direct averaging, indirect first-order averaging, and/or indirect multi-order averaging. Regardless of whether averaging is involved, another calibration option includes leveraging an additional (and, for example, an idle) reconfigurable LUT memory (e.g., from another linearization circuit for another nonlinear ADC) to store initial calibration data, intermediate calibration data, and/or updated calibration data related to the nonlinear ADC 102. In such case, determining the updated calibration data based on the initial calibration data involves accessing both reconfigurable LUT memories. An additional linearization circuit and related reconfigurable LUT memory may be available, for example, in an ADC topology that uses parallel nonlinear ADCs and related linearization circuits to provide an overall ADC output value (e.g., an averaged ADC output).

In some example embodiments, the reconfigurable LUT memory 108 is configured to store the initial calibration data in an uncompressed format. In such case, determining the updated calibration data based on the initial calibration data takes up more memory (compared to a compressed format) and involves some complexity due to addressing of the reconfigurable LUT being different in the calibration mode compared to the operational mode. As another option, the reconfigurable LUT memory 108 may be configured to store the initial calibration data in a compressed format. In such case, determining the updated calibration data based on the initial calibration data may involve converting the initial calibration data from the compressed format to an uncompressed format. Once the updated calibration data is determined based on the initial calibration data, the reconfigurable LUT memory 108 may store the updated calibration data in a compressed format. In some example embodiments, the reconfigurable LUT memory 108 stores a separate LUT based on the updated calibration data for each of multiple phases of the linearization circuit 106.

After the updated calibration data are stored in the reconfigurable LUT memory 108, the linearization circuit 106 may switch to the operational mode. During the operational mode of the linearization circuit 106, the nonlinear ADC 102 is configured to provide a first digital output signal based on an unknown analog input signal (in the calibration mode, the analog input signal may be a known value so that the digital output value can be associated with the known analog input signal in the LUT, for example). The linearization circuit 106 is configured to provide a second digital output at the linearization circuit output based on the first digital output and the updated calibration data (or related LUTs) stored by the reconfigurable LUT memory 108. As desired, calibration operations for the linearization circuit 106 are performed as an initial calibration (e.g., when the nonlinear ADC 102 and the linearization circuit 106 are powered on). As another option, calibrations operations may be performed periodically based on a schedule, a calibration trigger, and/or other control options. With the calibration operations, initial calibration data, intermediate calibration data and updated calibration data are stored as needed using the reconfigurable LUT memory 108, where the size of the reconfigurable LUT memory 108 is strategically limited based on needs of the operational mode and/or another strategic limit.

The ADC technique 100 of FIG. 1 achieves linear ADC behavior with lower power consumption and less size (lower cost) compared to a pipelined ADC topology. With the reconfigurable LUT memory 108 of the ADC technique 100 and related calibration operations, calibration errors (e.g., due to DAC flicker noise) in the updated calibration data are reduced compared to the initial calibration data without adding additional LUT memory to the linearization circuit 106. In other words, the reconfigurable LUT memory 108 is used to support operational mode and calibration mode operations of the linearization circuit 106; where the calibration mode includes calibration error correction operations. In some example embodiments, calibration mode operations are managed by a calibration control circuit (e.g. the calibration control circuit 370 in FIG. 3) coupled to or included with the linearization circuit 106. If idle nonlinear ADCs and related linearization circuits are available, a calibration control circuit may perform calibration operations for a given linearization circuit using multiple reconfigurable LUT memories. Depending on the number of reconfigurable LUT memories available, the calibration options for a given linearization circuit may vary (e.g., more iterations of single DAC ramp fills may be averaged).

Figure 2:
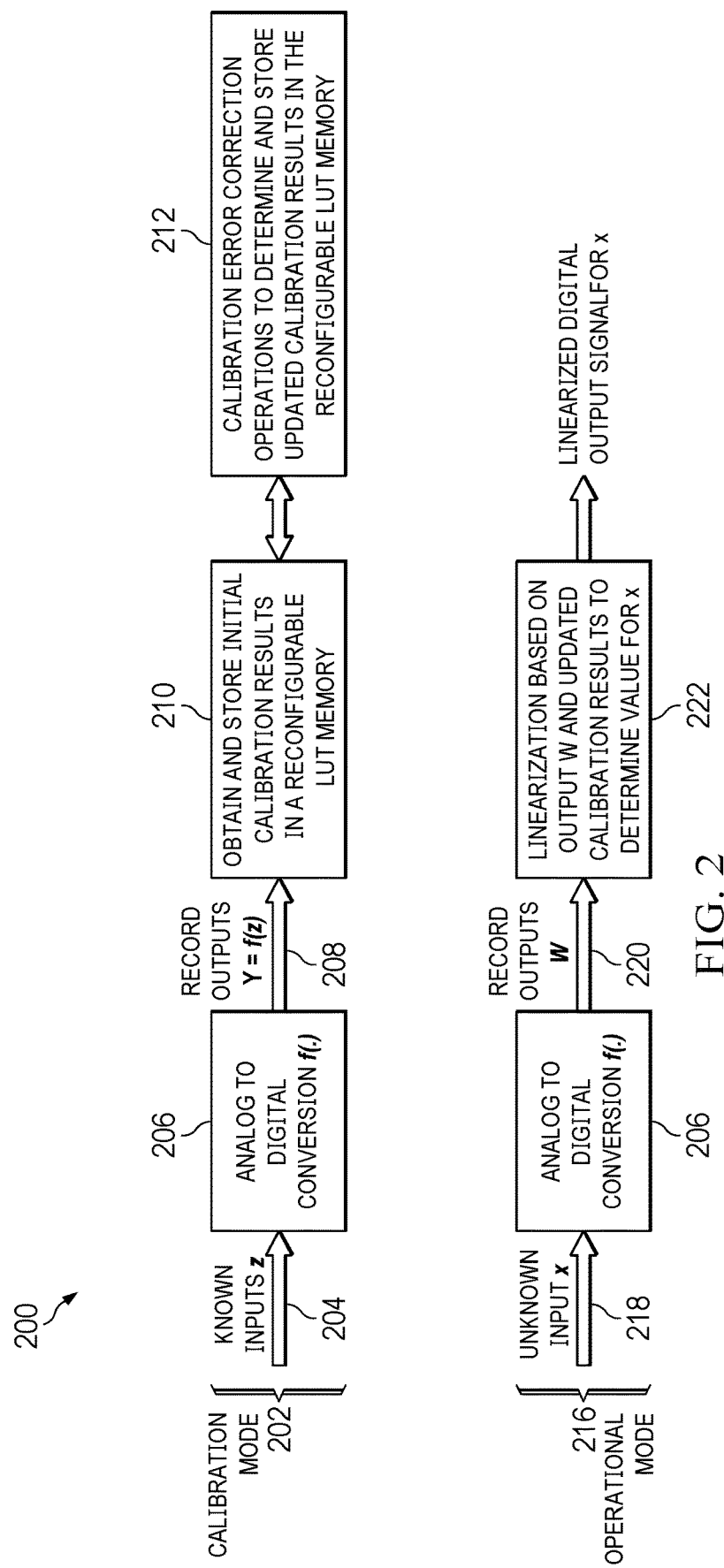
FIG. 2 is a diagram showing features of a calibration mode and operational mode for an ADC technique in accordance with an example embodiment.

FIG. 2 is a diagram showing features of a calibration mode 202 and operational mode 216 for an ADC technique 200 in accordance with an example embodiment. During the calibration mode 202 of the ADC technique 200, known analog input values 204 (labeled z) are provided to a nonlinear ADC block 206 (an example of the nonlinear ADC 102 in FIG. 1) having conversion function f(•). The ADC output values 208 (labeled Y, where Y=f(z)) from the nonlinear ADC block 206 and the analog input values 204 are used to obtain and store initial calibration data in a reconfigurable LUT memory (e.g., the reconfigurable LUT memory 108 in FIG. 1) at block 210. Calibration error correction operations are then performed at block 212 to determine and store updated calibration data in the reconfigurable LUT memory.

In some example embodiments, the initial calibration data is stored in a compressed format at block 210. In such case, the calibration error correction operations of block 212 may include converting the initial calibration data from the compressed format to an uncompressed format as part of determining the updated calibration data. In some example embodiments, determining the updated calibration data at block 212 involves averaging the uncompressed initial calibration data. In different example embodiments, the averaging options may vary (e.g., direct averaging, indirect first-order averaging, indirect multi-order averaging, etc.). As another option, the reconfigurable LUT memories of two linearization circuits could be leveraged to perform at least some of the operations of blocks 210 and 212. An additional linearization circuit and related reconfigurable LUT memory may be available, for example, in an ADC topology that uses parallel nonlinear ADCs and related linearization circuits to provide an overall ADC output value (e.g., an averaged ADC output).

During the operational mode 216 of the ADC technique 100, an unknown input value 218 (labeled x) is provided to the nonlinear ADC block 206. The nonlinear ADC block 206 outputs an ADC output value 220 (labeled W) based on the unknown input value 218. In some example embodiments, the ADC output value 220 is recorded/stored (e.g., in volatile or non-volatile memory that may be included on the same integrated circuit as the ADC or on a different integrated circuit). At block 222, the ADC output values 220 and the updated calibration data (determined at block 212 of the calibration mode 202) are used to determine a linearized digital output signal for x. With the nonlinear ADC block 206 and the linearization operations of block 222, the operational mode 216 of the ADC technique 200 approximates a linear ADC.

The ADC technique 200 of FIG. 2 achieves linear ADC behavior with less power consumption and less area (e.g., less cost) compared to a pipelined ADC topology. With a reconfigurable LUT memory (e.g., the reconfigurable LUT memory 108) and related calibration error correction operations (e.g., block 212), the ADC technique 200 determines updated calibration data (with reduced calibration error) without adding additional memory to a linearization circuit relative to what is used for the operational mode 216. Besides using the reconfigurable LUT memory 108 for calibration operations related to a nonlinear ADC, the reconfigurable LUT memory 108 could be used for other types of calibration operations and/or storage operations of a related circuit. In some example embodiments, blocks 210 and 212 of the calibration mode 202 are performed by a calibration control circuit (e.g., the calibration control circuit 370 in FIG. 3) for a linearization circuit and related nonlinear ADC. If multiple nonlinear ADCs and related linearization circuits are available; a calibration control circuit may perform the operations of blocks 210 and 212 using multiple reconfigurable LUT memories, Depending on the number of reconfigurable LUT memories available, the options for performing calibration mode operations may vary.

Figure 3:
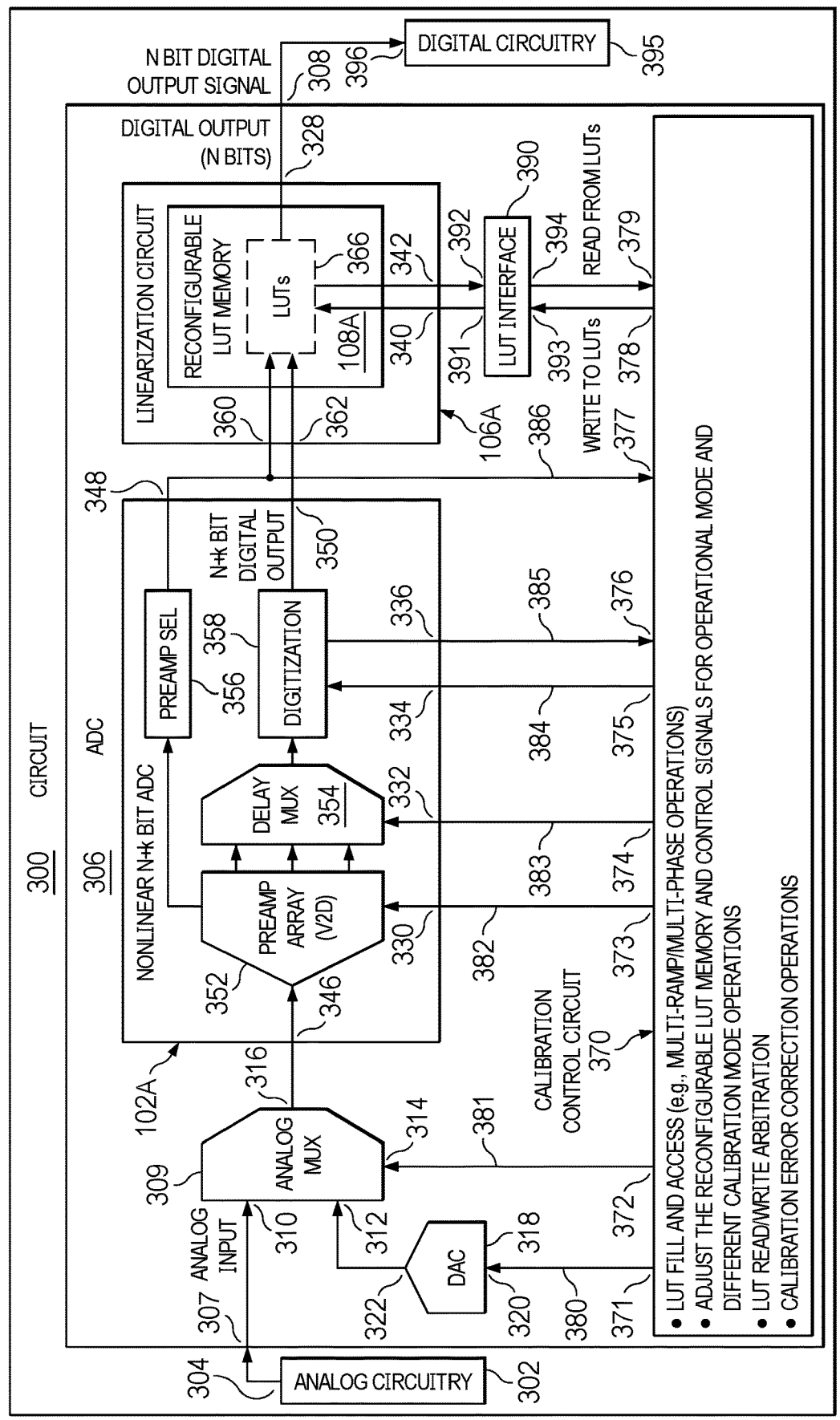
FIG. 3 is a block diagram showing a circuit having an ADC in accordance with an example embodiment.

FIG. 3 is a block diagram showing a circuit 300 having an ADC 306 in accordance with an example embodiment. In some example embodiments, the ADC 306 is configured to perform the ADC technique 100 of FIG. 1 and/or the ADC technique 200 of FIG. 2. In some example embodiments, the circuit 300 may be an integrated circuit, a circuit with an IC and external components (e.g., other ICs and/or discrete components) coupled via a printed circuit board (PCB), a package with multiple ICs, a microcontroller, and/or other components. As shown, the circuit 300 includes the ADC 306 positioned between analog circuitry 302 and digital circuitry 395. More specifically, the ADC 306 includes an ADC input 307 and an ADC output 308. The ADC input 307 is adapted to be coupled to an analog circuitry output 304 of the analog circuitry 302. In operation, the analog circuitry 302 is configured to provide an analog input signal at the analog circuitry output 304, and the ADC 306 is configured to receive the analog input signal at the ADC input 307. Without limitation, examples of the analog circuitry 302 include sense circuitry (to sense a voltage or current in part of the circuit 300), receiver circuitry (e.g., an antenna and receiver components), and/or other analog circuits. The ADC output 308 is adapted to be coupled to a digital circuitry input 396 of the digital circuitry 395. In operation, the ADC 306 is configured to provide a digital output signal at the ADC output 308 (based on the analog input signal analog and the operations of the linearization circuit 104A and the calibration control circuit 370). The digital circuitry 395 is configured to receive the digital output signal at the digital circuitry input 396. The digital circuitry 395 may store the digital output signal and/or use the digital output signal to perform calculations, to control operations, and/or other operations of the circuit 300. Examples of the digital circuitry 395 include a microprocessor, programmable logic, memory, other digital circuits, and/or digital output interface circuits.

As shown, the ADC 306 includes various components including an analog multiplexer 309, a DAC 318, a nonlinear N+k bit ADC 102A (an example of the nonlinear ADC 102 in FIG. 1), an N bit linearization circuit 106A (an example of the linearization circuit 106 in FIG. 1), an LUT interface 390, and a calibration control circuit 370. The analog multiplexer 309 has a first multiplexer input 310, a second multiplexer input 312, a multiplexer control input 314 and a multiplexer output 316. The DAC 318 has a DAC input 320 and a DAC output 322. The nonlinear N+k bit ADC 102A includes a first nonlinear ADC input 346, a second nonlinear ADC input 330, a third nonlinear ADC input 332, a fourth nonlinear ADC input 334, a first nonlinear ADC output 336, a second nonlinear ADC output 348, and a third nonlinear ADC output 350. The N bit linearization circuit 106A includes a first linearization circuit input 360, a second linearization circuit input 362, a third linearization circuit input 340, a first linearization circuit output 328 and a second linearization circuit output 342. The LUT interface 390 includes a first LUT interface input 392, a second LUT interface input 393, a first LUT interface output 391, and a second LUT interface output 394. The calibration control circuit 370 includes a first calibration control circuit input 376, a second calibration control circuit input 377, a third calibration control circuit input 379, a first calibration control circuit output 371, a second calibration control circuit output 372, a third calibration control circuit output 373, a fourth calibration control circuit output 374, a fifth calibration control circuit output 375, and a sixth calibration control circuit output 378. In operations, the calibration control circuit 370 is configured to: provide a DAC control signal 380 at the first calibration control circuit output 371; provide a multiplexer control signal 381 at the second calibration control circuit output 372; provide preamplifier array control signal 382 at the third calibration control circuit output 373; provide a delay multiplexer control signal 383 at the fourth calibration control circuit output 374; provide a digitization control signal 384 at the fifth calibration control circuit output 375; and provide calibration data at the sixth calibration control circuit output 378.

In FIG. 3, the DAC input 320 is coupled to the first calibration control circuit output 371, and the DAC output 322 is coupled to the second multiplexer input 312. In operation, the DAC 318 is configured to provide a DAC output signal at the DAC output 322 based on the DAC control signal 380 received at the DAC input 320. As shown, the first multiplexer input 310 is coupled to the ADC input 307, the second multiplexer input 312 is coupled to the DAC output 322, the multiplexer control input 314 is coupled to the second calibration control circuit output 372, and the multiplexer output 316 is coupled to first nonlinear ADC input 346. In operation, the analog multiplexer 309 is configured to: receive the analog input signal at the first multiplexer input 310; receive the DAC output signal at the second multiplexer input 312; provide the analog input signal to the multiplexer output 316 in response to the multiplexer control signal 381, received at the multiplexer control input 314, having a first value; and provide the DAC output signal to the multiplexer output 316 in response to the multiplexer control signal 381, received at the multiplexer control input 314, having a second value.

In the example of FIG. 3, the nonlinear N+k bit ADC 102A has a delay domain topology. In other example embodiments, the nonlinear N+k bit ADC 102A may have a folding interpolation topology, or other nonlinear ADC topology. Without limitation to other delay domain topologies, the nonlinear N+k bit ADC 102A includes a preamplifier array 352, a delay multiplexer 354, a preamplifier selection circuit 356 and a digitization circuit 358. The preamplifier array 352 is configured to: receive the output of the analog multiplexer 309 via the first nonlinear ADC input 346; provide a sense or control signal to the preamplifier selection circuit 356; and provide a set of delay domain signals to the delay multiplexer 354 based on the output of the analog multiplexer 309 and the preamplifier array control signal 382, which is received at the second nonlinear ADC input 330. In some example embodiments, the preamplifier array control signal 382 may be based on a preamplifier selection control signal 386 output from the preamplifier selection circuit 356 and provided to calibration control circuit 370 via the second nonlinear ADC output 348.

The delay multiplexer 354 is configured to: receive the delay domain signals from the preamplifier array 352; and forward one of the received delay domain signals based on the delay multiplexer control signal 383 received at the third nonlinear ADC input 332. The delay domain signal output from the delay multiplexer 354 is provided to the digitization circuit 358, which digitizes the received delay domain signal (resulting in an N+k bit digital output signal).

In operation, the nonlinear N+k bit ADC 102A includes of a V2D (voltage-to-delay) preamplifier array (e.g., the preamplifier array 352) followed by a delay resolving backend ADC (e.g., the digitization circuit 358). The preamplifier array 352 may include a single or multiple preamplifiers with different thresholds. If a single preamplifier is used, its output directly couples to the delay resolving backend ADC. If multiple preamplifiers are used, the preamplifier selection circuit 356 is configured to select one of the preamplifier outputs for the delay resolving backend ADC. In the operational mode, the preamplifier selection circuit 356 is configured to select the preamplifier whose threshold is closest to the analog input. In calibration mode, the calibration control circuitry 370 may override the preamplifier selection circuit 356 and select any preamplifier output as needed.

In some example embodiments, the operations of the digitization circuit 358 may be adjusted by the digitization control signal 384. The N+k bit digital output signal from the digitization circuit 358 is provided to the third nonlinear ADC output 350 and is the digital output signal from the N+k nonlinear ADC 102A. The N+k bit digital output signal (or related signal 385) may also be provided to the calibration control circuit 370 via the first nonlinear ADC output 336.

As shown, the linearization circuit 106A includes a reconfigurable LUT memory 108A (an example of the reconfigurable LUT memory 108 in FIG. 1) having LUTs 366. In the calibration mode, the linearization circuit 106A is configured to store initial calibration data, intermediate calibration data and/or updated calibration data obtained by the calibration control circuit 370 in the LUTs 366 of the reconfigurable LUT memory 108A. In some example embodiments, initial calibration data, intermediate calibration data and/or the updated calibration data may be received at the third linearization circuit input 340 of the linearization circuit 106A for storage in the reconfigurable LUT memory 108A. As another option, the linearization circuit 106A may also be configured to provide initial calibration data, intermediate calibration data and/or updated calibration data from the LUTs 366 of the reconfigurable LUT memory 108A to the second linearization circuit output 342 (e.g., to enable the calibration control circuit 370 to perform calibration error correction operations).

In some example embodiments, the LUT interface 390 arbitrates writes to the reconfigurable LUT memory 108A by the calibration control circuit 370 and/or reads from the reconfigurable LUT memory 108A by the calibration control circuit 370. Such reads and/or writes may involve receipt, buffering, arbitration, and/or transfer of initial calibration data, intermediate calibration results and/or updated calibration data between the LUTs 366 and the calibration control circuit 370 via the LUT interface 390. In some example embodiments, the calibration control circuit 370 includes a digital circuit configured to calibrate one or more ADCs. Whether one ADC or multiple ADCs are to be calibrated, the calibration control circuit 370 may access the LUTs for multiple ADCs to perform calibration for a given ADC. In some example embodiments, the LUT interface 390 includes circuitry that enables the calibration control circuit 370 to read from multiple LUTs (e.g., LUTs of the reconfigurable LUT memory 108A and/or LUTs of at least one other reconfigurable LUT memory). In order to reliably read from multiple LUTs across multiple linearization circuits, arbitration logic may schedule multiple read requests. The LUT interface 390 also enables the calibration control circuit 370 to selectively write to one or many LUTs (e.g., LUTs of the reconfigurable LUT memory 108A and/or LUTs of at least one other reconfigurable LUT memory).

In some example embodiments, the calibration control circuit 370 may include a digital circuitry, a processor, a microcontroller), memory and/or a combination thereof. The memory may store calibration instructions, along with other data and/or instructions. The calibration instructions, when executed by the processor, may cause the processor to calibrate the preamplifier array 352, the digitization circuit 358, control schemes for the DAC 318, and/or compression/decompression instructions to perform LUT data fill and LUT data access operations. Without limitation, the calibration control circuit 370 may be an integrated circuit (IC), such as a custom application-specific IC (ASIC) or part of a field-programmable gate array (FPGA).

In operation, the calibration control circuit 370 is configured to: perform operations to fill and/or access the LUTs 366; adjust the reconfigurable LUT memory 108A and provide control signals (e.g., the DAC control signal 380, the multiplexer control signal 381, the preamplifier array control signal 382, the delay multiplexer control signal 383, the digitization control signal 384) for the operational mode and different calibration mode operations (e.g., to obtain the initial calibration data, the intermediate calibration data and/or the updated calibration data); perform LUT read/write arbitration; and/or perform calibration error correction operations. In some example embodiments, the LUT interface 390 is configured to provide the calibration control circuit 370 with access to multiple LUTs related to one or more ADCs. The arbitration logic of the LUT interface 390 ensures that multiple read requests are appropriately scheduled, and that data is reliably read from multiple LUTs related to one or more ADCs. Such arbitration logic also may ensure writes are directed only to the LUTs selected by the calibration control circuit 370.

In some example embodiments, the calibration error correction operations performed by the calibration control circuit 370 include DAC flicker noise averaging. In some example embodiments, DAC flicker noise averaging is performed using uncompressed initial calibration data stored in the reconfigurable LUT memory 108A. As another option, initial calibration data may be stored in a compressed format in the reconfigurable LUT memory 108A. In such case, the initial calibration data may be converted from the compressed format to an uncompressed format. For example, an inversion algorithm may be used to extract uncompressed initial calibration data (sometimes referred to as raw ADC data) from compressed initial calibration data stored in the reconfigurable LUT memory 108A. With uncompressed initial calibration data, the LUTs 366 may be treated as raw storage bits (to accumulate uncompressed initial calibration data related to multiple DAC ramp iterations). In such example embodiments, direct averaging of the initial calibration data to determine the updated calibration data may be performed using the uncompressed initial calibration data stored in the reconfigurable LUT memory 108A. As another option, indirect averaging (e.g., first-order indirect averaging or multi-order indirect averaging) of initial calibration data to determine the updated calibration data may be performed based on compressed initial calibration data stored in the reconfigurable LUT memory 108A. In different example embodiments, direct or indirect averaging (e.g., first-order indirect averaging or multi-order indirect averaging) of initial calibration data is performed to determine the updated calibration data. As another option, compressed or uncompressed initial calibration data may be distributed and stored in multiple reconfigurable LUT memories (including the reconfigurable LUT memory 108A). As needed, the operations of the calibration control circuit 370 and/or the LUT interface 390 may account for read/write arbitration issues related to calibration error correction operations using the reconfigurable LUT memories 108A or multiple reconfigurable LUT memories.

Figure 4:
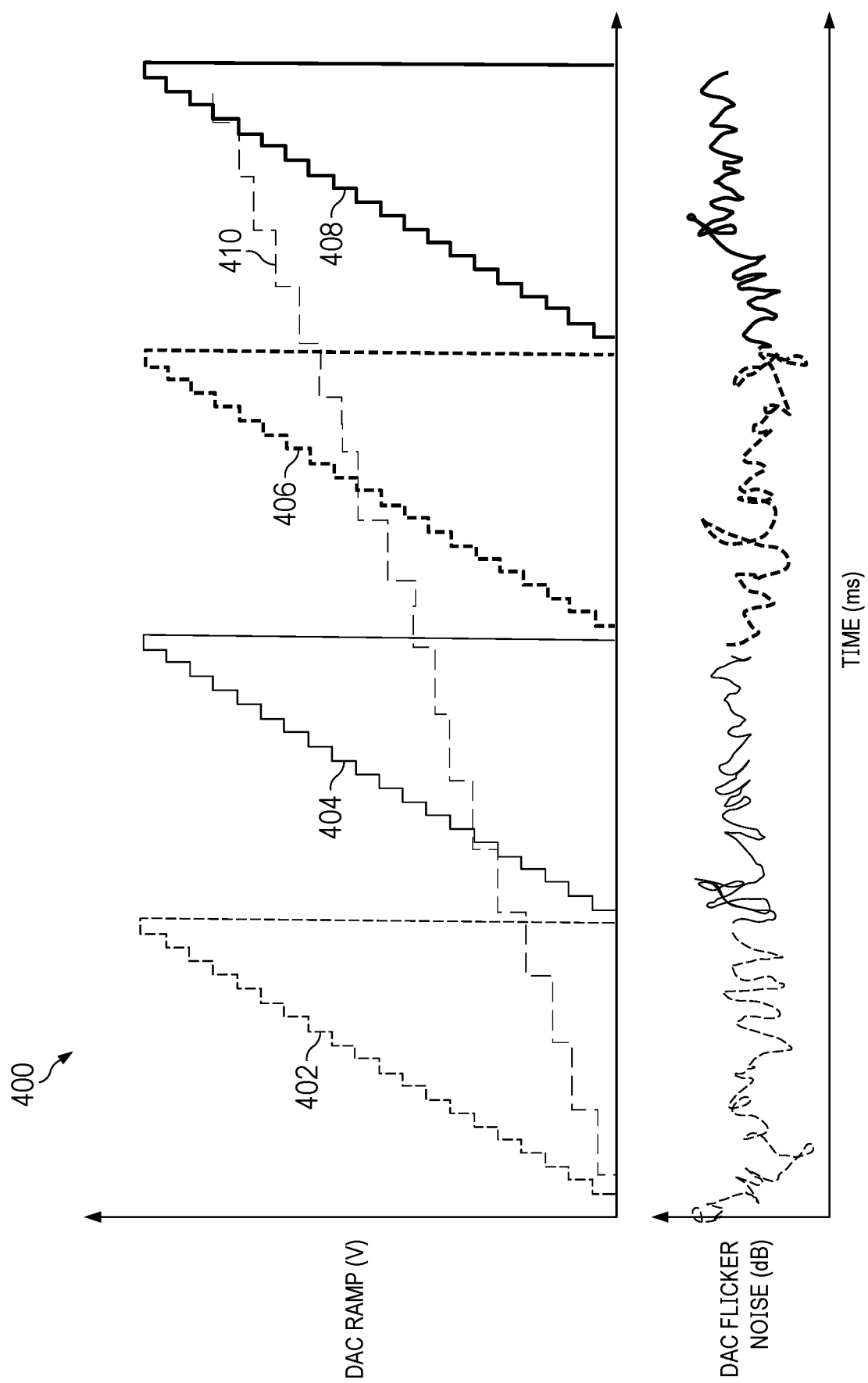
FIG. 4 is a graph showing digital-to-analog converter (DAC) ramps and DAC flicker noise as a function of time.

FIG. 4 is a graph 400 showing DAC ramps and DAC flicker noise as a function of time. In graph 400, there are four DAC ramps 402, 404, 406, and 408, where each of the DAC ramps 402, 404, 406, and 408 cycle through a set of DAC output values (e.g., based on respective input DAC codes or a test cycle) starting from lowest to highest. There is also a single DAC ramp 410 related to a conventional approach. As shown in FIG. 4, DAC flicker noise (random low-frequency noise due to current sources which make up a DAC) varies as a function of time such that each of the DAC ramps 402, 404, 406, and 408 may be affected differently by the DAC flicker noise. The single DAC ramp 410 is also affected by DAC flicker noise, where the amount of flicker noise power for the single DAC ramp 410 is approximately the same as the amount of flicker noise power for all of the DAC ramps 402, 404, 406, and 408 in combination. Compared to the conventional approach of using the single DAC ramp 410, averaging multiple faster DAC ramps (e.g., the DAC ramps 402, 404, 406, and 408) will result in lower DAC flicker noise.

Assuming N samples are obtained for the single DAC ramp 410, the number of samples obtained for all of the DAC ramps 402, 404, 406, and 408 in combination will also be N (i.e., N/4 for each of the DAC ramps 402, 404, 406, and 408). As the number of DAC ramps increase, the flicker noise suppression achieved by averaging the DAC ramps increases. Without limitation, eight or more DAC ramps may be used to achieve a target flicker noise suppression. In this manner, DAC flicker noise and possibly other types of noise (e.g., thermal noise) may be averaged without increasing the number of samples used relative to the conventional approach related to the single DAC ramp 410. Relative to the conventional approach of using the single DAC ramp 410, implementation of multiple DAC ramps will have a little more overhead due to digital-to-analog hand-offs and DAC settling times. For example, use of 4 DAC ramps with 16 sample averaging for each DAC ramp would in practice take slightly more time than the single DAC ramp 410 with 64 sample averaging.

In some example embodiments, each DAC ramp is initial calibration data, or is used to determine initial calibration data, for a linearization circuit (e.g., the linearization circuit 106 in FIG. 1, or the linearization circuit 106A in FIG. 3). In some example embodiments, the average of multiple DAC ramps (e.g., four DAC ramps as in graph 400, eight DAC ramps, sixteen DAC ramps, or another amount) are used to determine updated calibration data that reduces calibration error (e.g., due to DAC flicker noise and/or other types of noise or error). The updated calibration data is stored in the LUTs (e.g., LUTs 366 in FIG. 3) of a (reconfigurable or non-reconfigurable, for example) LUT memory (e.g., the reconfigurable LUT memory 108A in FIG. 3) and is used during the operational mode of a linearization circuit (e.g., the linearization circuit 106A in FIG. 3). As desired, calibration of a linearization circuit may be performed as an initial calibration (part of start-up), a periodic calibration, a scheduled calibration, and/or a trigger-based calibration.

Figure 5:
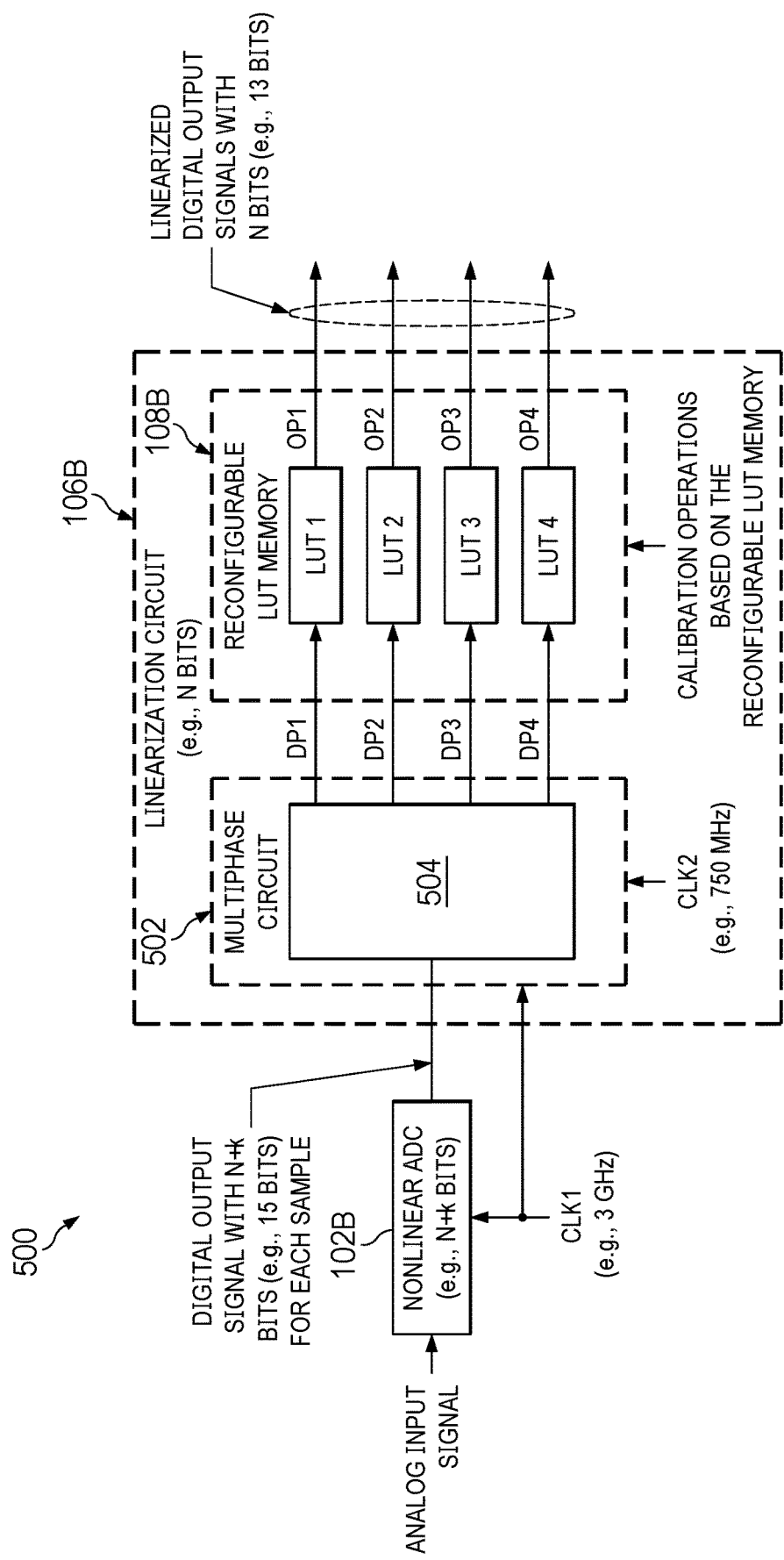
FIG. 5 is a block diagram a nonlinear ADC and a linearization circuit in accordance with an example embodiment.

FIG. 5 is a block diagram a nonlinear ADC 102B (an example of the nonlinear ADC 102 in FIG. 1, or the nonlinear ADC 102A in FIG. 3) and a linearization circuit 106B (an example of the linearization circuit 106 in FIG. 1, or the linearization circuit 106A in FIG. 3) in accordance with an example embodiment. In the example of FIG. 5, the nonlinear ADC 102B is configured to: receive an analog input signal; sample the analog input signal or a related analog signal (e.g., a scaled version of the analog input signal); and provide a digital output signal with N+k bits for each sample to represent the analog input signal as a function of time. The nonlinear ADC 102B is clocked using a first clock signal (CLK1), which controls the sample rate and the output rate. In some example embodiments, N+k=15 (e.g., N=13 and k=2) and CLK1=3 GHz. In other example embodiments, the values for N+k and/or CLK1 may vary.

The digital output signals from the nonlinear ADC 102B are provided to the linearization circuit 106B. In the example of FIG. 5, the linearization circuit 106B includes a multiphase circuit 502, which is configured to: receive the digital outputs signals from the nonlinear ADC 102B at a rate based on CLK1; provide the digital output signals to different data paths (labeled DP1, DP2, DP3, DP4 in FIG. 5) of the linearization circuit 106B using a second clock signal (CLK2). In some example embodiments, CLK2=750 MHz (e.g., 3 GHz divided by four paths) and there are four data paths for the linearization circuit 106B. In other example embodiments, the value of CLK2 and/or the number of data paths for the linearization circuit 106B may vary. In some example embodiments, the multiphase circuit 502 includes data path selection logic 504 configured to receive each digital output signal from the nonlinear ADC 102B and forward each respective digital output signal to one of the respective data paths (e.g., DP1, DP2, DP3, or DP4).

As shown, the linearization circuit 106B also includes a reconfigurable LUT memory 108B (an example of the reconfigurable LUT memory 108 in FIG. 1, or the reconfigurable LUT memory 108A in FIG. 3). For each data path (e.g., DP1, DP2, DP3, DP4) of the linearization circuit 106B, the reconfigurable LUT memory 108B is configured to maintain a respective LUT (e.g., LUT1, LUT2, LUT3, LUT4 in FIG. 5) based on the updated calibration data for use during the operational mode of the linearization circuit 106B. In some example embodiments, the linearization circuit 106B is configured to access the LUTs (e.g., LUT1, LUT2, LUT3, LUT4) during the operational mode to determine linearized digital output signals with N bits at a rate based on CLK2. In some example embodiments, N=13. In other example embodiments, the value of N may vary. Since there are four outputs paths (labeled OP1, OP2, OP3, OP4) for the linearization circuit 106B (each clocked using different phases of CLK2 such as CLK2+0°, CLK2+90°, CLK2+180°, and CLK2+270°), the total serialized rate at which the linearization circuit 106B may provide a digital output signal is the same as CLK1 (e.g., 3 GHz if CLK2 is 750 MHz). As another option, the linearization circuit 106B could provide the outputs from OP1, OP2, OP3, OP4 as separate parallel outputs at a rate based on CLK2. For example, final data from the linearization circuit 106B may be serialized, while various operations of the linearization circuit 106B are parallel operations.

In the example of FIG. 5, calibration mode operations for the linearization circuit 106B use the reconfigurable LUT memory 108B to store initial calibration data, intermediate calibration data, or updated calibration data. In some example embodiments, the LUTs (e.g., LUT1, LUT2, LUT3, LUT4) of the reconfigurable LUT memory 108B store compressed data. Table 1 shows an example of an LUT architecture in accordance with an example embodiment.

TABLE 1

| Address | 13-bit running sum | Single bits 31:0 |
|---|---|---|
| 0 | 0 | Bits: 0 to 31 |
| 1 | Sum: 0 to 31 | Bits: 32 to 63 |
| 2 | Sum: 0 to 63 | Bits: 64 to 96 |
| ... | ... | ... |
| 179 | Sum: 0 to 178*32-1 | Bits: 179*32 to 180*32-1 |
| ... | ... | ... |
| 1023 | Sum: 0 to 1023*32-1 | Bits: 1024*32 to 1024*32-1 |

With the LUT architecture of Table 1, there are N+k−5 address bits (e.g., N+k−5=10). The most significant bits (MSBs) of raw ADC data are the address. Single bits are optimized from 32 to 31 bits. There are 5 least significant bits (LSBs) of raw ADC data, and the running sum is optimized from 13 to 11 bits. In other example embodiments, 16 or 64 single bits may be used instead of 32. With the LUT architecture of Table 1, the size of the LUT needed for each DAC ramp is approximately 42 k bits (rather than approximately 120K bits for an LUT without compression). In some example embodiments, calibration error correction operations of a calibration control circuit (e.g., the calibration control circuit 370) involve performing an inverse operation to recover raw ADC data from compressed LUT data before averaging the raw ADC data to determine the updated calibration data.

In the operational mode of the linearization circuit 106B of FIG. 5, each phase supported by the multiphase circuit 502 uses a separate LUT. During the calibration mode, an idle state, or an unused state, one LUT may be sufficient to retain memory content or write new content. Accordingly, if there are four LUTs (an in the example of FIG. 5), one of the four LUTs may be used to retain the memory content or write new content based on the updated calibration data, while the other three LUTs can be reconfigured as storage for calibration error correction operations (e.g., flicker noise averaging) based on the initial calibration data. Before the operational mode begins, the contents of the LUT with updated calibration data may be copied to all of the LUTs. In some example embodiments, a linearization circuit 106B with K data paths will have K LUTs, where K−1 of the LUTs can be reconfigured as storage for calibration error correction operations (e.g., flicker noise averaging) as desired.

In some example embodiments, flicker noise averaging is based on averaging raw ADC data related to multiple DAC ramps, where raw ADC data is N+k bits and the final linear ADC output (after LUT) is N bits. In such example embodiments, saving one full DAC ramp ($2^N$ codes) means $2^N*$(N+k) bits of storage. For N=13 and k=2, 120K bits of storage are needed for each DAC ramp. Also, each LUT has $2^{N+k−5}*(31+N−2)$ bits. For N=13 and k=2, each LUT has approximately 42 k bits. The averaging that can be achieved using compressed data LUTs may be somewhat limited.

In some example embodiments, calibration error correction operations (e.g., flicker noise averaging) involve accumulating raw ADC data across multiple DAC ramps and averaging the raw ADC data. If the single raw ADC code related to a single DAC ramp is 15 bits, then the single raw ADC code for 2 DAC ramps will 16 bits. For 16 DAC ramps, each raw ADC code will be 19 bits (15+4 bits). For M DAC ramps, the raw ADC code will be $16+\log_2 M$ bits. If N=13, each DAC ramp will have $8192*(2^{13})$ DAC codes. In such case, approximately 155K bits are sufficient to store the data for 16 DAC ramps. To perform raw ADC data storage in the calibration mode of the linearization circuit 106B, updates to LUT memory interfacing as well as updates to addressing and read arbitration are performed (relative to operational mode LUT memory interfacing, addressing, and read arbitration).

In some example embodiments, calibration error correction operations (e.g., flicker noise averaging) involve inverting compressed LUT data to perform averaging operations. In such example embodiments, the LUTs of the reconfigurable LUT memory 108B may be designed to work for monotonic functions and convert a nonlinear and monotonic N+k bit ADC code into a linear N bit ADC code. In such case, the LUTs are not intended as a storage for raw ADC data. In other words, LUTs of a linearization circuit (e.g., the linearization circuit 1066) may be designed to store the information of a full DAC ramp but not in a format that can be read out as the raw ADC code resulting from a DAC code. In such embodiments, raw ADC codes may be reverse engineered from the compressed DAC ramp data while complying with the following criteria: 1) monotonicity of the underlying function is maintained; and 2) corner cases (e.g., preamplifier overlap regions, memory overflows, and/or cumulative sum overflows) are accounted for.

Figure 6:
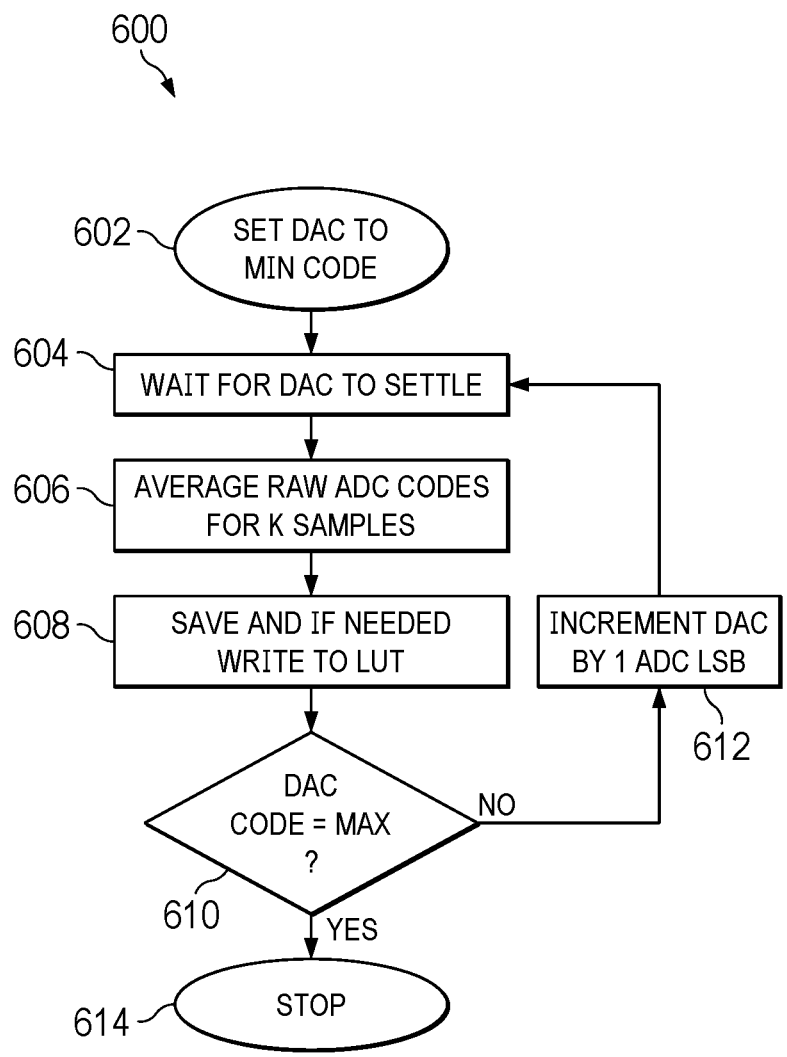
FIG. 6 is a flowchart showing a method to obtain initial calibration data based on a DAC ramp in accordance with an example embodiment.

FIG. 6 is a flowchart showing a method 600 to obtain initial calibration data based on a DAC ramp in accordance with an example embodiment. The method 600 may be performed by a calibration control circuit (e.g., the calibration control circuit 370 of FIG. 3). At block 602, the DAC is set to a minimum code (the minimum code of the DAC or a minimum DAC code for calibration). At block 604, the DAC settles for a time. At block 606, raw ADC codes for K samples are averaged. At block 608, the averaged raw ADC codes for K samples are saved and may be written to an LUT. If the DAC code is at a maximum (determination block 610), the method 600 stops at block 614. Otherwise, the method 600 increments the DAC output by one ADC step (1 ADC LSB) at block 612, and then returns to block 604.

Figure 7:
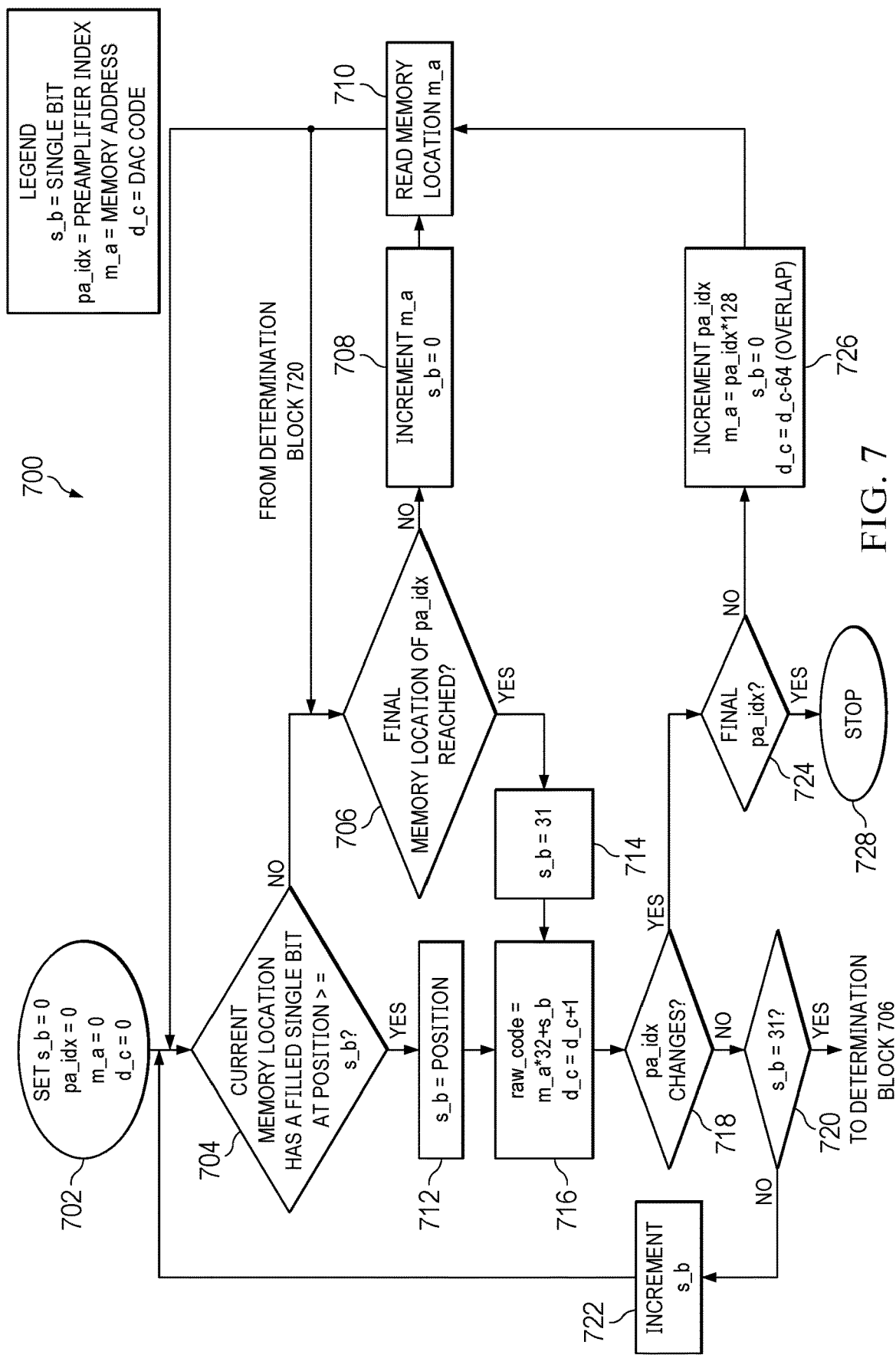
FIG. 7 is a flowchart showing a method of converting compressed calibration data in a reconfigurable LUT memory to uncompressed calibration data in accordance with an example embodiment.

FIG. 7 is a flowchart showing a method 700 of converting compressed calibration data in a LUT memory (e.g., the reconfigurable LUT memory 108 in FIG. 1, the reconfigurable LUT memory 108A in FIG. 3, or the reconfigurable LUT memory 108B in FIG. 5) to uncompressed calibration data (raw ADC data) in accordance with an example embodiment. The method 700 may be performed by a calibration control circuit (e.g., the calibration control circuit 370 of FIG. 3). As shown, the method 700 includes zeroing various parameters including: a single-bit (s_b); a preamplifier index (pa_idx); a memory address (m_a); and a DAC code (d_c). In other words, s_b is set to 0, pa_idx is set to 0, m_a is set to 0, and d_c is set to 0 at block 702. If the current memory location has a filled single bit at a position greater than or equal to s_b (determination block 704), the method 700 sets s_b equal to the position at block 712. If the current memory location does not have a filled single bit at a position greater than or equal to s_b (determination block 704) and the final memory location of pa_idx has been reached (determination block 706), the method 700 sets s_b equal to 31 and the method 700 continues at block 716.

At block 716, a raw ADC code (raw_code) is determined as raw_code=m_a*32+s_b, and d_c is incremented by one. If pa_idx is changed (determination block 718) and pa_idx is at its final value (determination block 724), the method stops at block 728. If pa_idx is changed (determination block 718) and pa_idx is not at its final value (determination block 724), pa_idx is incremented, m_a=pa_idx*128, s_b is set to 0, and d_c−64 (overlap condition). The method 700 then proceeds to read the memory location m_a at block 710.

If pa_idx does not change (determination block 718) and s_b does not equal 31 (determination block 720), s_b is incremented at block 722, and the method 700 returns to block 704. If s_b equals 31 (determination block 720), the method 700 proceeds to determination block 706. The method 700 also proceeds to determination block 706 if the current memory location does not have a filled single bit at a position greater than or equal to s_b (determination block 704). If the final memory location of pa_idx is not reached (determination block 706), m_a is incremented and s_b is set to 0 at block 708 and method 700 proceeds to block 710. At block 710, the memory location related to m_a is read, and the method 700 proceeds to block 704. In different example embodiments, the compression and related decompression technique may vary.

Figure 8A:
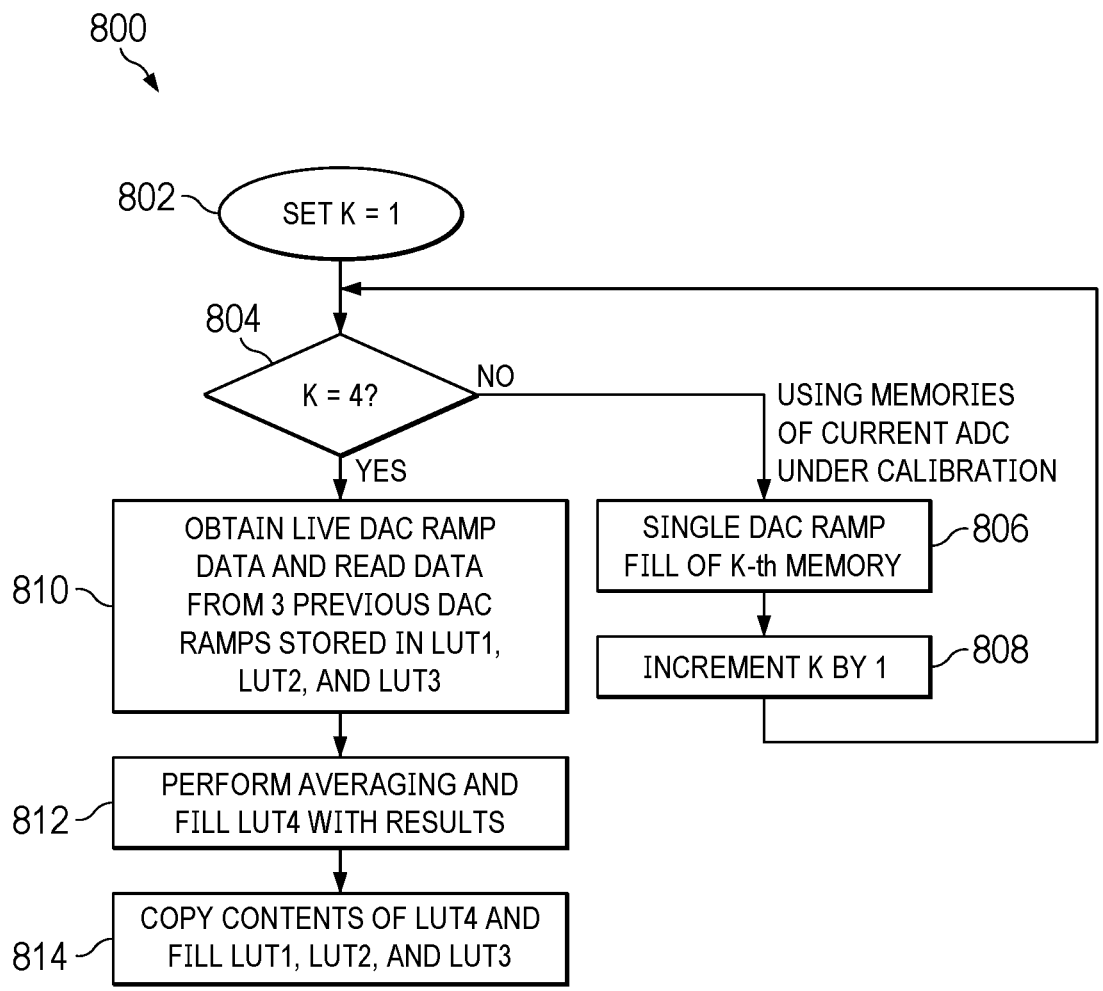
FIG. 8A is a flowchart showing a method of averaging initial calibration data using a reconfigurable LUT memory in accordance with example embodiment.
Figure 9A:
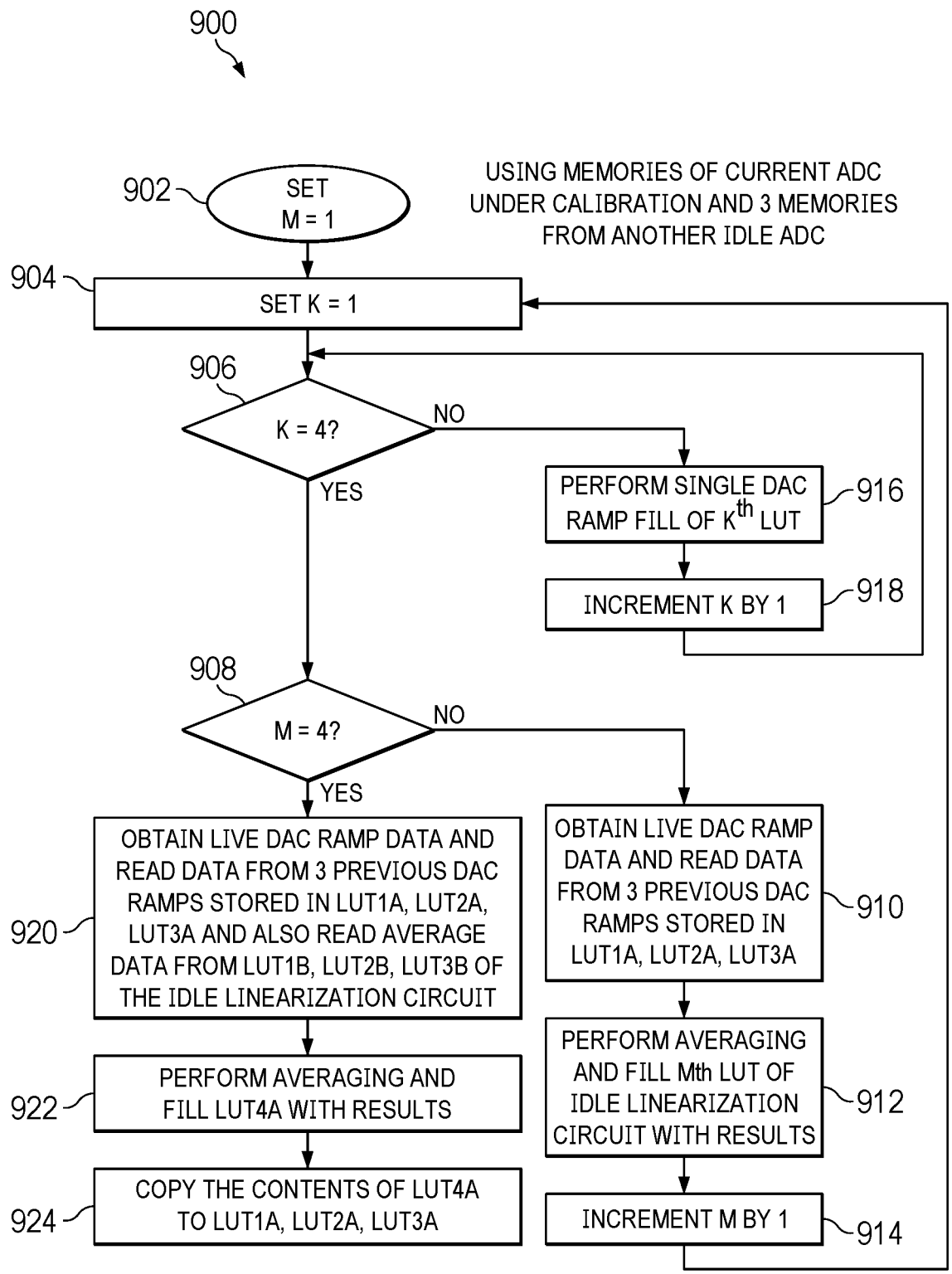
FIG. 9A is a flowchart showing another method of averaging initial calibration data using a reconfigurable LUT memory in accordance with example embodiment.

FIGS. 8A and 9A are flowcharts showing methods 800 and 900 of averaging initial calibration data using a LUT memory (e.g., the reconfigurable LUT memory 108 in FIG. 1, the reconfigurable LUT memory 108A in FIG. 3, or the reconfigurable LUT memory 108B in FIG. 5) in accordance with example embodiments. In some example embodiments, the methods 800 and 900 may be performed by a calibration control circuit (e.g., the calibration control circuit 370 of FIG. 3). With the method 800 of FIG. 8A, the data of four DAC ramps is averaged. In contrast, the method 900 of FIG. 9A averages the data of 16 DAC ramps. In other example embodiments, other quantities of DAC ramps may be averaged.

In the method 800 of FIG. 8A, a reconfigurable LUT memory with four LUTs (e.g., LUT1, LUT2, LUT3, and LUT4) is used (where "K" is used to denote the number of the LUT, LUTK). As shown, the method 800 starts at block 802 with K being set to 1. If K does not equal 4 (determination block 804), a single DAC ramp fill of the $K^{th}$ LUT is performed at block 806, and method 800 proceeds to block 808. At block 808, K is incremented by 1, and the method 800 returns to block 804. The repetition of blocks 804, 806 and 808 results in filling LUT1, LUT2, LUT3 based on respective DAC ramps. Once K=4 (determination block 804), live DAC ramp data is obtained and data from three previous DAC ramps (stored in LUT1, LUT2, and LUT3) is read at block 810. At block 812, averaging the DAC ramp data is performed and LUT4 is filled based on the averaged data. At block 814, the contents of LUT4 are copied to fill LUT1, LUT2, and LUT3 (to prepare the LUTs for the operational mode of the related linearization circuit).

Figure 8B:
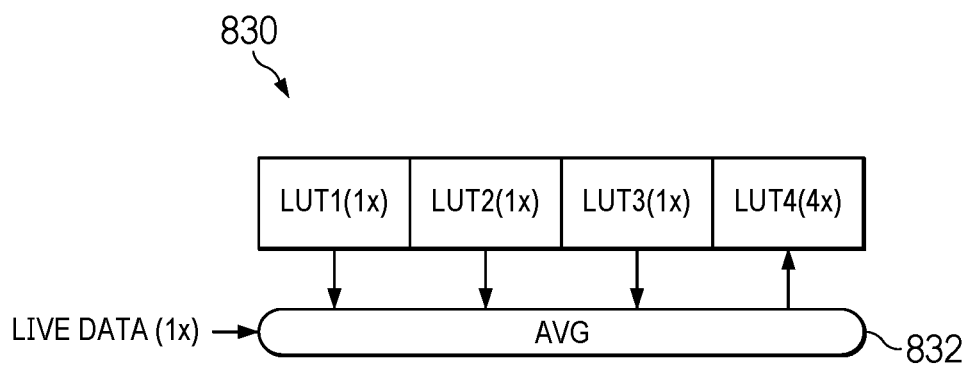
FIG. 8B is a diagram related to the method of FIG. 8A in accordance with example embodiment.

FIG. 8B is a diagram 830 related to the method 800 of FIG. 8A in accordance with example embodiment. In the diagram 830, four LUTs (LUT1, LUT2, LUT3, LUT4) are represented. LUT1 is used to store first DAC ramp data. LUT2 is used to store second DAC ramp data. LUT3 is used to store third DAC ramp data. The data stored in LUT1, LUT2, LUT3 as well as live DAC ramp data (not stored) are averaged by averaging block 832 (which is comprised of a processor, digital circuitry, a microcomputer, memory and/or a combination thereof—alternatively, averaging block 832 may be implemented by other architecture, which may or may not perform other functions). The results of the averaging block 832 are stored in LUT4 and represent the updated calibration data. The updated calibration data stored in LUT4 may then be copied and used to fill LUT1, LUT2, LUT3 based on the updated calibration data. With method 800 and related diagram 830, a 4 times averaging of DAC ramp data is achieved, which suppresses DAC flicker noise.

In the method 900 of FIG. 9A, a LUT memory with four LUTs (e.g., LUT1A, LUT2A, LUT3A, LUT4A) is used. Also, availability of an additional idle ADC and related linearization circuit with four more LUTs (LUT1B, LUT2B, LUT3B, LUT4B) is used. Without limitation, three of the four LUTs of the idle ADC and related linearization circuit are available for calibration operations of an ADC and related linearization circuit being calibrated (the other LUT of the idle ADC and related linearization circuit may maintain a set of calibration data for the idle ADC and related linearization circuit). At block 902, M is set to 1 (where "M" represents a number corresponding to the additional idle LUTs, such as LUTMB). At block 904, K is set to 1 (where K represents a number corresponding to the LUTs of the instant linearization circuit, such as LUTKA). If K is not equal to 4 (determination block 906), a single DAC ramp of the Kth LUT is performed at block 916. At block 918, K is incremented by 1. The repetition of blocks 906, 916 and 918 results in filling LUT1A, LUT2A, LUT3A based on respective DAC ramps. Once K=4 (determination block 906), a determination is made regarding whether M=4 (determination block 908). If not, live DAC ramp data is obtained and data from 3 previous DAC ramps stored in LUT1A, LUT2A, LUT3A is read at block 910. At block 912, averaging of the live DAC ramp data and the DAC ramp data stored in LUT1A, LUT2A, LUT3A is performed, and the $M^{th}$ LUT of the idle linearization circuit is filled with the results. At block 914, M is incremented by 1, and the method 900 returns to block 904.

The method 900 repeats blocks 904, 906, 908, 910, 912, 914, 916, and 918 until M is equal to 4 (determination block 908). Once M=4, live DAC ramp data is obtained and data from 3 previous DAC ramps stored in LUT1A, LUT2A, LUT3A is read at block 920. Also, averaged data from the three LUTs of the idle linearization circuit (e.g., LUT1B, LUT2B, LUT3B) are read at block 910. At block 922, averaging of the data obtained at block 920 is performed and LUT4A is filled with the results. At block 924, the contents of LUT4A are copied and used to fill LUT1A, LUT2A, LUT3A.

Figure 9B:
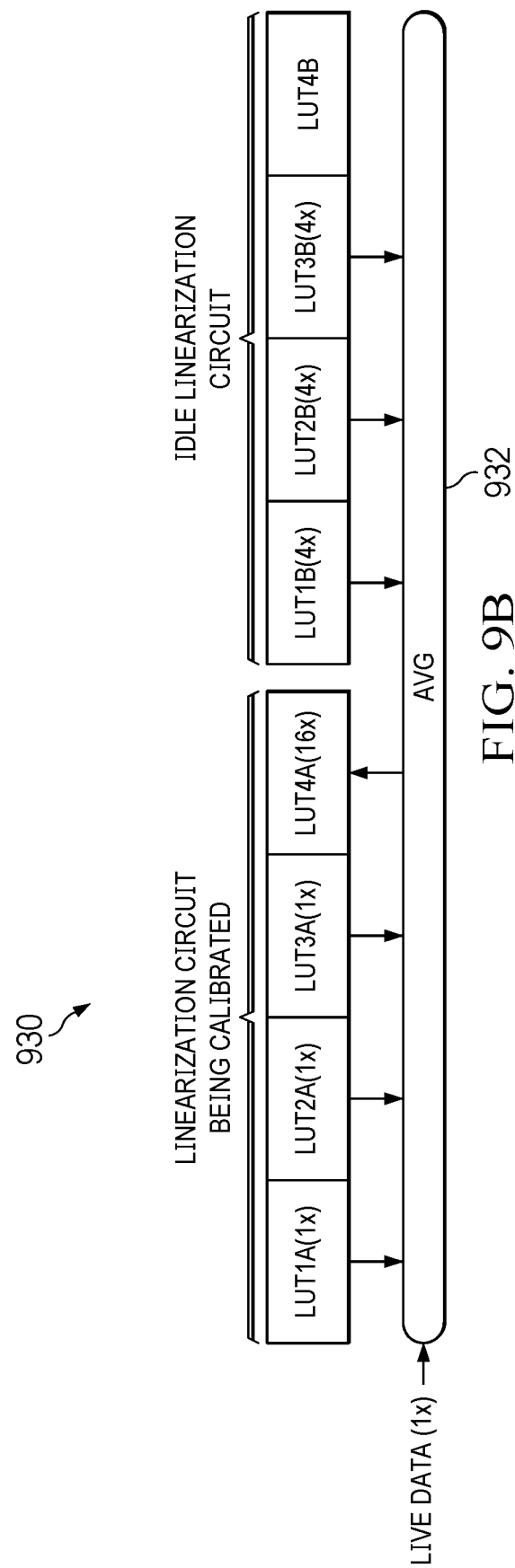
FIG. 9B is a diagram related to the method of FIG. 9A in accordance with example embodiment.

FIG. 9B is a diagram 930 related to the method 900 of FIG. 9A in accordance with example embodiment. In the diagram 930, four LUTs (LUT1A, LUT2A, LUT3A, LUT4A) of a linearization circuit being calibrated and four LUTs of an idle linearization circuit (LUT1B, LUT2B, LUT3B, LUT4B) are represented. In the diagram 930, the final step of a 16×DAC ramp data averaging is shown. More specifically, LUT1A is used to store first DAC ramp data (e.g., data of DAC ramp 13). LUT2A is used to store second DAC ramp data (e.g., data of DAC ramp 14). LUT3A is used to store third DAC ramp data (e.g., data of DAC ramp 15). The data stored in LUT1A, LUT2A, LUT3A and live DAC ramp data (e.g., live DAC ramp data related to DAC ramp 16) as well as the previously averaged data of DAC ramps 1 to 12 stored in LUT1B, LUT2B and LUT3B are averaged by averaging block 932. For example, LUT1B may store the averaged data of DAC ramp 1 to DAC ramp 4, LUT2B may store the averaged data of DAC ramp 5 to DAC ramp 8, and LUT3B may store the averaged data of DAC ramp 9 to DAC ramp 12. The results of the averaging block 932 are stored in LUT4A and represent the updated calibration data. The updated calibration data stored in LUT4A may then be copied and used to fill LUT1A, LUT2A, LUT3A with LUT data for use during the operational mode of a related linearization circuit. With method 900 and related diagram 930, a 16 times averaging of DAC ramp data is achieved, which suppresses DAC flicker noise even more than the 4 times averaging option described in FIGS. 9A and 9B.

In some example embodiments, all nonlinear ADCs and related linearization circuits are idle. In such example embodiments, K−1 memories of each of the linearization circuits can be used for averaging operations. For example, if there are 4 linearization circuits and K=4, there are 16 total LUTs and 13 of the LUTs are available for averaging operations. As another example, in a system with 10 ADCs and 10 linearization circuits, averaging operations up to 256× would be possible. Table 2 is an example of averaging options for a system with 10 linearization circuits.

TABLE 2

| Idle linearization circuit | Total LUTs available | Total DAC ramps averaged | Distribution | Averaging technique |
|---|---|---|---|---|
| 0 | 4 | 4 | 1 + 1 + 1 + 1 = 4(1) | Direct ($0^{th}$ order) |
| 0 | 4 | 8 | 4 + 2 + 1 + 1 = 1(4) + 1(2) + 2(1) | Indirect $1^{st}$ order |
| 1 | 7 = 4 + 3 | 16 | 4 + 4 + 4 + 1 + 1 + 1 + 1 = 3(4) + 4(1) | Indirect $1^{st}$ order |
| 10 | 31 = 4 + 9*3 | 256 | 15(16) + 16(1) | Indirect $1^{st}$ order |

As shown in Table 2, the number of idle linearization circuits may vary between 0 to 10 in a system with 10 linearization circuits. The total number of LUTs available for averaging operations may vary, which changes the number of DAC ramps that can be averaged. Depending on the number of linearization circuits and LUTs available, the distribution of DAC ramp data and the averaging technique may vary. If divisions other than power of 2 are performed, then for L available memories averaging up to $1+\Sigma_{i=1}^{L-1}(i+1)$ can be achieved. For the last example in Table 2 (31 LUTs available) the averaging maximum is 496. With multi-order (e.g., second order) indirect averaging, more even more averaging is possible, but averaging accuracy may suffer.

In some example embodiments, calibration mode operations involve managing LUT memory interfacing and arbitration. Example LUT memory interfacing and arbitration operations include: 1) reconfiguring the reconfigurable LUT memory for data storage in a compressed format or in an uncompressed format; 2) support writes during the calibration mode to LUTs related to different phases; 3) support reads during the calibration mode to read the contents of any one of the phase-specific LUTs; 4) support calibrating a given linearization circuit based on reads/writes related to other available linearization circuits; 5) convert data in a compressed format to data in an uncompressed format (e.g., reverse engineer raw ADC code); 6) perform averaging based on arbitration between the several read requests; 7) use a single read and write interface that enables access to all ADCs (e.g., 10 ADCs or more), where the reconfigurable LUT memory may use 10 address bits, 42 read data and 42 write data bits; 8) support one-hot encoding to separately select the linearization circuit to read from and another/same linearization circuit to write to; 9) use four separate commands (e.g., wr_mem_en commands) to separately control LUTs of a linearization circuit; and/or 10) use binary encoding for reads. With LUT memory interfacing and arbitration operations, area and routing congestion is reduced since only 1 read and 1 write bus is sufficient.

Figure 10:
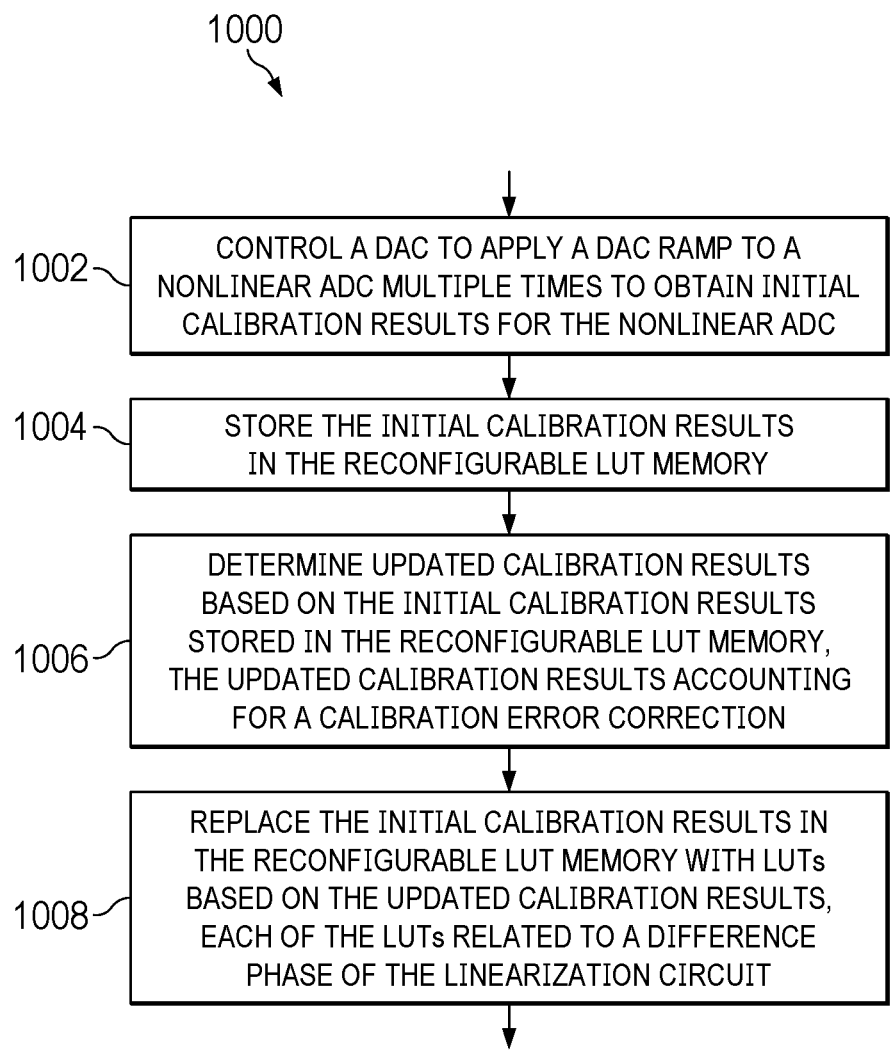
FIG. 10 is a flowchart showing a calibration method for a linearization circuit related to a nonlinear ADC in accordance with an example embodiment.

FIG. 10 is a flowchart showing a calibration method 1000 for a linearization circuit (e.g., the linearization circuit 106 in FIG. 1, the linearization circuit 106A in FIG. 3, or the linearization circuit 106B in FIG. 5) related to a nonlinear ADC (e.g., the nonlinear ADC 102 in FIG. 1, the N+k nonlinear ADC 102A in FIG. 3, the nonlinear ADC 102B in FIG. 5) in accordance with an example embodiment. The method 1000 may be performed, for example, by the calibration control circuit 370 of FIG. 3. As shown, the method 1000 includes controlling a DAC (e.g., the DAC 318 in FIG. 3) to apply a DAC ramp to a nonlinear ADC multiple times to obtain initial calibration data for the nonlinear ADC at block 1002. At block 1004, the initial calibration data is stored in a LUT memory (e.g., the reconfigurable LUT memory 108 in FIG. 1, the reconfigurable LUT memory 108A in FIG. 3, or the reconfigurable LUT memory 108B in FIG. 5). At block 1006, updated calibration data is determined based on the initial calibration data, where the updated calibration data accounts for a calibration error correction. At block 1008, the initial calibration data in the reconfigurable LUT memory is replaced with LUTs based on the updated calibration data, where each of the LUTs is related to a difference phase of the linearization circuit. In some example embodiments, the operations of blocks 1002 and 1006 may be performed by a calibration control circuit (e.g., the calibration control circuit 370 of FIG. 3), while the operations of blocks 1004 and 1008 are performed by a linearization circuit (e.g., the linearization circuit 106 in FIG. 1, the linearization circuit 106A in FIG. 3, or the linearization circuit 106B in FIG. 5).

In some example embodiments, determining the updated calibration data at block 1006 includes: converting the initial calibration data from a compressed format to an uncompressed format; and averaging the initial calibration data in the uncompressed format. In some example embodiments, the nonlinear ADC is a first nonlinear ADC, the linearization circuit is a first linearization circuit, the reconfigurable LUT memory is a first reconfigurable LUT memory, and the method 1000 further comprises distributing the initial calibration data in the first reconfigurable LUT memory and a second reconfigurable LUT memory of a second linearization circuit related to a second nonlinear ADC.

With calibration mode operations using a reconfigurable LUT memory as described herein, various options are possible. In some example embodiments, an inversion algorithm is used to extract raw ADC raw code from a compressed memory LUT (e.g., with 3× less area) for averaging monotonic nonlinear functions. As another option, an LUT fill algorithm may apply multiple DAC ramps and perform flicker noise averaging using reconfigurable memory. In some example embodiments, up to K direct averaging can be performed using the LUTs of a linearization circuit. For an ADC with K phased memory, more than 2K first order indirect averaging can be done using the same ADC's LUT memory. For an ADC with K phased memory, more than 2MK first order indirect averaging can be done using a given reconfigurable LUT memory and other M−1 unused/idle reconfigurable LUT memories (e.g., K−1 memories from the unused/idle linearization circuits may be used).

In some example embodiments, a theoretical limit of $1+\Sigma_{i=1}^{L-1}(i+1)$ is possible when L memories are available. As another option, a memory interfacing architecture and arbitration scheme may be used to achieve reconfigurable hardware. In some example embodiments, the reconfigurable LUT memory is used for different purposes in operational mode and calibration mode. As another option, flicker noise averaging is performed without additional memory by treating the reconfigurable LUT memory as raw storage bits to accumulate raw codes across multiple ramps.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. A circuit comprising:
a nonlinear analog-to-digital converter (ADC) having a nonlinear ADC input and a nonlinear ADC output, the nonlinear ADC is configured to:
receive an analog input signal at the nonlinear ADC input; and
provide a first digital output signal at the nonlinear ADC output based on the analog input signal;
a linearization circuit having a linearization circuit input, a linearization circuit output and a lookup table (LUT) memory configured to store initial calibration data, the linearization circuit input is coupled to the nonlinear ADC output and the linearization circuit is configured to:
determine updated calibration data based on the initial calibration data;
replace the initial calibration data in the LUT memory with the updated calibration data; and
provide a second digital output signal at the linearization circuit output based on the first digital output signal and the updated calibration data; and
a calibration control circuit coupled to the linearization circuit, and the calibration control circuit is configured to:
access the initial calibration data stored in the LUT memory; and
average the initial calibration data to determine the updated calibration data.

2. The circuit of claim 1, wherein the first digital output signal has more bits than the second digital output signal, and linearization circuit is configured to:
store the initial calibration data in an uncompressed format in the LUT memory; and
store a separate LUT for each of multiple phases of the linearization circuit, each of the separate LUTs based on the updated calibration data and having a compressed format.

3. The circuit of claim 1, wherein the initial calibration data include calibration data from multiple iterations of applying a digital-to-analog converter (DAC) ramp to the nonlinear ADC.

4. The circuit of claim 1, wherein the linearization circuit is configured to store the initial calibration data in an uncompressed format in the LUT memory, and the calibration control circuit is configured to average the initial calibration data based on direct averaging of the initial calibration data.

5. The circuit of claim 1, wherein the linearization circuit is configured to store the initial calibration data in a compressed format in the LUT memory, and the calibration control circuit is configured to:
convert the initial calibration data from the compressed format to an uncompressed format; and
average the initial calibration data in the uncompressed format to determine the updated calibration data.

6. The circuit of claim 5, wherein the calibration control circuit is configured to average the initial calibration data based on indirect first-order averaging of the initial calibration data after the initial calibration data is converted from the compressed format to the uncompressed format.

7. The circuit of claim 5, wherein the calibration control circuit is configured to average the initial calibration data based on indirect multi-order averaging of the initial calibration data after the initial calibration data is converted from the compressed format to the uncompressed format.

8. The circuit of claim 1, wherein the nonlinear ADC is a first nonlinear ADC, the linearization circuit is a first linearization circuit, the LUT memory is a first LUT memory, the circuit further comprises a second nonlinear ADC and a second linearization circuit, and the calibration control circuit is configured to:
access initial calibration data related to the first nonlinear ADC and distributed in the first LUT memory and a second LUT memory of the second linearization circuit;
determine updated calibration data for the first nonlinear ADC based on the initial calibration data distributed in the first LUT memory and the second LUT memory; and
write to the first LUT memory to store the updated calibration data for the first nonlinear ADC, the updated calibration data replacing the initial calibration data in the first LUT memory.

9. The circuit of claim 1, further comprising an LUT interface coupled to the linearization circuit and the calibration control circuit, wherein the LUT interface is configured to arbitrate read requests from the calibration control circuit to the LUT memory, and the read requests are related to the calibration control circuit averaging the initial calibration data.

10. The circuit of claim 9, wherein the nonlinear ADC is a first nonlinear ADC, the linearization circuit is a first linearization circuit, the LUT memory is a first LUT memory, the circuit further comprises a second nonlinear ADC and a second linearization circuit, the LUT interface is configured to arbitrate read requests from the calibration control circuit to the first LUT memory and a second LUT memory related to the second linearization circuit, and the read requests related to the calibration control circuit averaging the initial calibration data.

11. A linear analog-to-digital converter (ADC) comprising:
a nonlinear ADC configured to provide a first digital output signal based on an analog input signal;
a linearization circuit coupled to the nonlinear ADC and having a lookup table (LUT) memory configured to store initial calibration data, the linearization circuit is configured to:
store updated calibration data based on the initial calibration data;
replace the initial calibration data in the LUT memory with the updated calibration data; and
provide a second digital output signal at the linearization circuit output based on the first digital output signal and the updated calibration data; and
a calibration control circuit coupled to the linearization circuit, and the calibration control circuit is configured to:
access the initial calibration data stored in the LUT memory; and
average the initial calibration data to determine the updated calibration data.

12. The linear ADC of claim 11, wherein the first digital output signal has more bits than the second digital output signal, and linearization circuit is configured to:

store the initial calibration data in an uncompressed format in the LUT memory; and store a separate LUT for each of multiple phases of the linearization circuit, each of the separate LUTs based on the updated calibration data and having a compressed format.

13. The linear ADC of claim 11, wherein the initial calibration data include calibration data from multiple iterations of applying a digital-to-analog converter (DAC) ramp to the nonlinear ADC.

14. The linear ADC of claim 11, wherein the linearization circuit is configured to store the initial calibration data in an uncompressed format in the LUT memory, and the calibration control circuit is configured to average the initial calibration data based on direct averaging of the initial calibration data.

15. The linear ADC of claim 11, wherein the linearization circuit is configured to store the initial calibration data in a compressed format in the LUT memory, and the calibration control circuit is configured to:

convert the initial calibration data from the compressed format to an uncompressed format; and average the initial calibration data in the uncompressed format to determine the updated calibration data.

16. The linear ADC of claim 15, wherein the calibration control circuit is configured to average the initial calibration data based on indirect first-order averaging or indirect multi-order averaging of the initial calibration data after the initial calibration data is converted from the compressed format to the uncompressed format.

17. The linear ADC of claim 11, wherein the nonlinear ADC is a first nonlinear ADC, the linearization circuit is a first linearization circuit, the LUT memory is a first LUT memory, and the calibration control circuit is configured to:

access initial calibration data related to the first nonlinear ADC and distributed in the first LUT memory and a second LUT memory of a second linearization circuit related to a second nonlinear ADC;

determine updated calibration data for the first nonlinear ADC based on the initial calibration data distributed in the first LUT memory and the second LUT memory; and write to the first LUT memory to store the updated calibration data for the first nonlinear ADC, the updated calibration data replacing the initial calibration data in the first LUT memory.

18. The linear ADC of claim 11, further comprising an LUT interface coupled to the linearization circuit and the calibration control circuit, wherein the LUT interface is configured to arbitrate read requests from the calibration control circuit to the LUT memory, and the read requests are related to the calibration control circuit averaging the initial calibration data.

19. A method for calibrating an ADC having a linearization circuit including a lookup table (LUT) memory, the method comprising:

controlling, by a calibration control circuit, a digital-to-analog converter (DAC) to apply a DAC ramp to the nonlinear ADC multiple times to obtain initial calibration data for the nonlinear ADC;

storing, by the linearization circuit, the initial calibration data in the LUT memory;

determine, by the calibration control circuit, updated calibration data based on the initial calibration data, including averaging the initial calibration data in an uncompressed format; and replacing, by the linearization circuit, the initial calibration data in the LUT memory with LUTs based on the updated calibration data.

20. The method of claim 19, wherein determining the updated calibration data includes:

converting the initial calibration data from a compressed format to the uncompressed format.

21. The method of claim 19, wherein the nonlinear ADC is a first nonlinear ADC, the linearization circuit is a first linearization circuit, the LUT memory is a first LUT memory, and the method further comprises distributing the initial calibration data in the first LUT memory and a second LUT memory of a second linearization circuit related to a second nonlinear ADC.

* * * * *